United States Patent
Bertness et al.

(10) Patent No.: US 8,344,685 B2
(45) Date of Patent: Jan. 1, 2013

(54) SYSTEM FOR AUTOMATICALLY GATHERING BATTERY INFORMATION

(75) Inventors: Kevin I. Bertness, Batavia, IL (US); John S. Philbrook, Cornelius, NC (US)

(73) Assignee: Midtronics, Inc., Willowbrook, IL (US)

( * ) Notice: Subject to any disclaimer, the term of this patent is extended or adjusted under 35 U.S.C. 154(b) by 730 days.

(21) Appl. No.: 12/416,457

(22) Filed: Apr. 1, 2009

(65) Prior Publication Data

US 2009/0212781 A1  Aug. 27, 2009

Related U.S. Application Data

(63) Continuation-in-part of application No. 11/207,419, filed on Aug. 19, 2005, now abandoned.

(60) Provisional application No. 60/603,078, filed on Aug. 20, 2004.

(51) Int. Cl.
*H02J 7/00* (2006.01)
*G01N 27/416* (2006.01)

(52) U.S. Cl. ........ 320/104; 320/112; 320/114; 320/137; 324/426; 324/427; 324/429

(58) Field of Classification Search .................. 320/104; 324/426
See application file for complete search history.

(56) References Cited

U.S. PATENT DOCUMENTS

| | | | |
|---|---|---|---|
| 85,553 A | 1/1869 | Adams | 33/472 |
| 2,000,665 A | 5/1935 | Neal | 439/440 |
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,267,452 A | 12/1963 | Wolf | 340/249 |
| 3,178,686 A | 4/1965 | Mills | 340/447 |
| 3,223,969 A | 12/1965 | Alexander | 340/447 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |

(Continued)

FOREIGN PATENT DOCUMENTS

DE    29 26 716 B1    1/1981

(Continued)

OTHER PUBLICATIONS

Office Action from U.S. Appl. No. 11/146,608 dated May 13, 2008.

(Continued)

*Primary Examiner* — Edward Tso
*Assistant Examiner* — Ahmed Omar
(74) *Attorney, Agent, or Firm* — Alan G. Rego; Westman, Champlin & Kelly, P.A.

(57) ABSTRACT

A method that includes affixing a radio frequency identification tag on a storage battery at a battery manufacturing plant. The method also includes storing battery manufacturing information into the radio frequency identification tag at the battery manufacturing plant. The battery manufacturing information includes a battery algorithm suitable for use in testing the storage battery.

41 Claims, 9 Drawing Sheets

U.S. PATENT DOCUMENTS

| | | | |
|---|---|---|---|
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |

| Patent No. | Date | Inventor | Class |
|---|---|---|---|
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,387,871 A | 2/1995 | Tsai | 324/429 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 320/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/434 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |

| Patent No. | Kind | Date | Inventor | Class |
|---|---|---|---|---|
| 6,037,751 | A | 3/2000 | Klang | 320/160 |
| 6,037,777 | A | 3/2000 | Champlin | 324/430 |
| 6,037,778 | A | 3/2000 | Makhija | 324/433 |
| 6,046,514 | A | 4/2000 | Rouillard et al. | 307/77 |
| 6,051,976 | A | 4/2000 | Bertness | 324/426 |
| 6,055,468 | A | 4/2000 | Kaman et al. | 701/29 |
| 6,061,638 | A | 5/2000 | Joyce | 702/63 |
| 6,064,372 | A | 5/2000 | Kahkoska | 345/173 |
| 6,072,299 | A | 6/2000 | Kurle et al. | 320/112 |
| 6,072,300 | A | 6/2000 | Tsuji | 320/116 |
| 6,075,339 | A | 6/2000 | Reipur et al. | 320/110 |
| 6,081,098 | A | 6/2000 | Bertness et al. | 320/134 |
| 6,081,109 | A | 6/2000 | Seymour et al. | 324/127 |
| 6,087,815 | A | 7/2000 | Pfeifer et al. | 323/282 |
| 6,091,238 | A | 7/2000 | McDermott | 324/207.2 |
| 6,091,245 | A | 7/2000 | Bertness | 324/426 |
| 6,094,033 | A | 7/2000 | Ding et al. | 320/132 |
| 6,097,193 | A | 8/2000 | Bramwell | 324/429 |
| 6,100,670 | A | 8/2000 | Levesque | 320/150 |
| 6,100,815 | A | 8/2000 | Pailthorp | 324/754.07 |
| 6,104,167 | A | 8/2000 | Bertness et al. | 320/132 |
| 6,113,262 | A | 9/2000 | Purola et al. | 374/45 |
| 6,114,834 | A | 9/2000 | Parise | 320/109 |
| 6,136,914 | A | 10/2000 | Hergenrother et al. | 524/495 |
| 6,137,269 | A | 10/2000 | Champlin | 320/150 |
| 6,140,797 | A | 10/2000 | Dunn | 320/105 |
| 6,144,185 | A | 11/2000 | Dougherty et al. | 320/132 |
| 6,147,598 | A | 11/2000 | Murphy et al. | 340/426.19 |
| 6,150,793 | A | 11/2000 | Lesesky et al. | 320/104 |
| 6,158,000 | A | 12/2000 | Collins | 713/1 |
| 6,161,640 | A | 12/2000 | Yamaguchi | 180/65.8 |
| 6,163,156 | A | 12/2000 | Bertness | 324/426 |
| 6,164,063 | A | 12/2000 | Mendler | 60/274 |
| 6,167,349 | A | 12/2000 | Alvarez | 702/63 |
| 6,172,483 | B1 | 1/2001 | Champlin | 320/134 |
| 6,172,505 | B1 | 1/2001 | Bertness | 324/430 |
| 6,177,737 | B1 | 1/2001 | Palfey et al. | 307/64 |
| 6,181,545 | B1 | 1/2001 | Amatucci et al. | 361/502 |
| 6,184,656 | B1 * | 2/2001 | Karunasiri et al. | 320/119 |
| 6,191,557 | B1 | 2/2001 | Gray et al. | 320/132 |
| 6,211,651 | B1 | 4/2001 | Nemoto | 320/133 |
| 6,215,275 | B1 | 4/2001 | Bean | 320/106 |
| 6,218,805 | B1 | 4/2001 | Melcher | 320/105 |
| 6,218,936 | B1 | 4/2001 | Imao | 340/447 |
| 6,222,342 | B1 | 4/2001 | Eggert et al. | 320/105 |
| 6,222,369 | B1 | 4/2001 | Champlin | 324/430 |
| D442,503 | S | 5/2001 | Lundbeck et al. | D10/77 |
| 6,225,808 | B1 | 5/2001 | Varghese et al. | 324/426 |
| 6,236,186 | B1 | 5/2001 | Helton et al. | 320/106 |
| 6,236,332 | B1 | 5/2001 | Conkright et al. | 340/3.1 |
| 6,236,949 | B1 | 5/2001 | Hart | 702/64 |
| 6,238,253 | B1 | 5/2001 | Qualls | 439/759 |
| 6,242,887 | B1 | 6/2001 | Burke | 320/104 |
| 6,249,124 | B1 | 6/2001 | Bertness | 324/426 |
| 6,250,973 | B1 | 6/2001 | Lowery et al. | 439/763 |
| 6,254,438 | B1 | 7/2001 | Gaunt | 439/755 |
| 6,259,170 | B1 | 7/2001 | Limoge et al. | 307/10.8 |
| 6,259,254 | B1 | 7/2001 | Klang | 324/427 |
| 6,262,563 | B1 | 7/2001 | Champlin | 320/134 |
| 6,263,268 | B1 | 7/2001 | Nathanson | 701/29 |
| 6,271,643 | B1 | 8/2001 | Becker et al. | 320/112 |
| 6,271,748 | B1 | 8/2001 | Derbyshire et al. | 340/442 |
| 6,275,008 | B1 | 8/2001 | Arai et al. | 320/132 |
| 6,285,191 | B1 | 9/2001 | Gollomp et al. | 324/427 |
| 6,294,896 | B1 | 9/2001 | Champlin | 320/134 |
| 6,294,897 | B1 | 9/2001 | Champlin | 320/153 |
| 6,304,087 | B1 | 10/2001 | Bertness | 324/426 |
| 6,307,349 | B1 | 10/2001 | Koenck et al. | 320/112 |
| 6,310,481 | B2 | 10/2001 | Bertness | 324/430 |
| 6,313,607 | B1 | 11/2001 | Champlin | 320/132 |
| 6,313,608 | B1 | 11/2001 | Varghese et al. | 320/132 |
| 6,316,914 | B1 | 11/2001 | Bertness | 320/134 |
| 6,320,351 | B1 | 11/2001 | Ng et al. | 320/104 |
| 6,323,650 | B1 | 11/2001 | Bertness et al. | 324/426 |
| 6,324,042 | B1 | 11/2001 | Andrews | 361/93.2 |
| 6,329,793 | B1 | 12/2001 | Bertness et al. | 320/132 |
| 6,331,762 | B1 | 12/2001 | Bertness | 320/134 |
| 6,332,113 | B1 | 12/2001 | Bertness | 702/63 |
| 6,346,795 | B2 | 2/2002 | Haraguchi et al. | 320/136 |
| 6,347,958 | B1 | 2/2002 | Tsai | 439/488 |
| 6,351,102 | B1 | 2/2002 | Troy | 320/139 |
| 6,356,042 | B1 | 3/2002 | Kahlon et al. | 318/138 |
| 6,356,083 | B1 | 3/2002 | Ying | 324/426 |
| 6,359,441 | B1 | 3/2002 | Bertness | 324/426 |
| 6,359,442 | B1 | 3/2002 | Henningson et al. | 324/426 |
| 6,363,303 | B1 | 3/2002 | Bertness | 701/29 |
| RE37,677 | E | 4/2002 | Irie | 315/83 |
| 6,377,031 | B1 | 4/2002 | Karuppana et al. | 323/220 |
| 6,384,608 | B1 | 5/2002 | Namaky | 324/430 |
| 6,388,448 | B1 | 5/2002 | Cervas | 324/426 |
| 6,392,414 | B2 | 5/2002 | Bertness | 324/429 |
| 6,396,278 | B1 | 5/2002 | Makhija | 324/402 |
| 6,407,554 | B1 | 6/2002 | Godau et al. | 324/503 |
| 6,411,098 | B1 | 6/2002 | Laletin | 324/436 |
| 6,417,669 | B1 | 7/2002 | Champlin | 324/426 |
| 6,420,852 | B1 | 7/2002 | Sato | 320/134 |
| 6,424,157 | B1 | 7/2002 | Gollomp et al. | 324/430 |
| 6,424,158 | B2 | 7/2002 | Klang | 324/433 |
| 6,437,957 | B1 | 8/2002 | Karuppana et al. | 361/78 |
| 6,441,585 | B1 | 8/2002 | Bertness | 320/150 |
| 6,445,158 | B1 | 9/2002 | Bertness et al. | 320/104 |
| 6,449,726 | B1 | 9/2002 | Smith | 713/340 |
| 6,456,036 | B1 | 9/2002 | Thandiwe | 320/106 |
| 6,456,045 | B1 | 9/2002 | Troy et al. | 320/139 |
| 6,465,908 | B1 | 10/2002 | Karuppana et al. | 307/31 |
| 6,466,025 | B1 | 10/2002 | Klang | 324/429 |
| 6,466,026 | B1 | 10/2002 | Champlin | 324/430 |
| 6,469,511 | B1 | 10/2002 | Vonderhaar et al. | 324/425 |
| 6,477,478 | B1 | 11/2002 | Jones et al. | 702/102 |
| 6,495,990 | B2 | 12/2002 | Champlin | 320/132 |
| 6,497,209 | B1 | 12/2002 | Karuppana et al. | 123/179.3 |
| 6,500,025 | B1 | 12/2002 | Moenkhaus et al. | 439/502 |
| 6,505,507 | B1 | 1/2003 | Imao | 73/146.5 |
| 6,507,196 | B2 | 1/2003 | Thomsen et al. | 324/436 |
| 6,526,361 | B1 | 2/2003 | Jones et al. | 702/63 |
| 6,529,723 | B1 | 3/2003 | Bentley | 455/405 |
| 6,531,848 | B1 | 3/2003 | Chitsazan et al. | 320/153 |
| 6,532,425 | B1 | 3/2003 | Boost et al. | 702/63 |
| 6,534,992 | B2 | 3/2003 | Meissner et al. | 324/426 |
| 6,534,993 | B2 | 3/2003 | Bertness | 324/433 |
| 6,536,536 | B1 | 3/2003 | Gass et al. | 173/2 |
| 6,544,078 | B2 | 4/2003 | Palmisano et al. | 439/762 |
| 6,545,599 | B2 | 4/2003 | Derbyshire et al. | 340/442 |
| 6,556,019 | B2 | 4/2003 | Bertness | 324/426 |
| 6,566,883 | B1 | 5/2003 | Vonderhaar et al. | 324/426 |
| 6,570,385 | B1 | 5/2003 | Roberts et al. | 324/378 |
| 6,577,107 | B2 | 6/2003 | Kechmire | 320/139 |
| 6,586,941 | B2 | 7/2003 | Bertness et al. | 324/426 |
| 6,597,150 | B1 | 7/2003 | Bertness et al. | 320/104 |
| 6,599,243 | B2 | 7/2003 | Woltermann et al. | 600/300 |
| 6,600,815 | B1 | 7/2003 | Walding | 379/93.07 |
| 6,611,740 | B2 | 8/2003 | Lowrey et al. | 701/29 |
| 6,614,349 | B1 | 9/2003 | Proctor et al. | 340/572.1 |
| 6,618,644 | B2 | 9/2003 | Bean | 700/231 |
| 6,621,272 | B2 | 9/2003 | Champlin | 324/426 |
| 6,623,314 | B1 | 9/2003 | Cox et al. | 439/759 |
| 6,624,635 | B1 | 9/2003 | Lui | 324/426 |
| 6,628,011 | B2 | 9/2003 | Droppo et al. | 307/43 |
| 6,629,054 | B2 | 9/2003 | Makhija et al. | 702/113 |
| 6,633,165 | B2 | 10/2003 | Bertness | 324/426 |
| 6,635,974 | B1 | 10/2003 | Karuppanana et al. | 307/140 |
| 6,667,624 | B1 | 12/2003 | Raichle et al. | 324/522 |
| 6,679,212 | B2 | 1/2004 | Kelling | 123/179.28 |
| 6,686,542 | B2 | 2/2004 | Zhang | 174/74 |
| 6,696,819 | B2 | 2/2004 | Bertness | 320/134 |
| 6,707,303 | B2 | 3/2004 | Bertness et al. | 324/426 |
| 6,736,941 | B2 | 5/2004 | Oku et al. | 203/68 |
| 6,737,831 | B2 | 5/2004 | Champlin | 320/132 |
| 6,738,697 | B2 | 5/2004 | Breed | 701/29 |
| 6,740,990 | B2 | 5/2004 | Tozuka et al. | 307/9.1 |
| 6,744,149 | B2 | 6/2004 | Karuppana et al. | 307/9 |
| 6,745,153 | B2 | 6/2004 | White et al. | 702/184 |
| 6,759,849 | B2 | 7/2004 | Bertness et al. | 324/426 |
| 6,771,073 | B2 | 8/2004 | Henningson et al. | 324/426 |
| 6,777,945 | B2 | 8/2004 | Roberts et al. | 324/426 |
| 6,781,382 | B2 | 8/2004 | Johnson | 324/426 |
| 6,784,635 | B2 | 8/2004 | Larson | 320/104 |
| 6,784,637 | B2 | 8/2004 | Raichle et al. | 320/107 |

| Patent No. | Date | Inventor | Class |
|---|---|---|---|
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,972,662 B1 | 12/2005 | Ohkawa et al. | 340/10.1 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,058,525 B2 | 6/2006 | Bertness et al. | 702/63 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,177,925 B2 | 2/2007 | Carcido et al. | 709/223 |
| 7,182,147 B2 | 2/2007 | Cutler et al. | 173/1 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al. | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,679,325 B2 | 3/2010 | Seo | 320/116 |
| 7,688,074 B2 | 3/2010 | Cox et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,597 B2 | 6/2010 | Bertness | 324/426 |
| 7,772,850 B2 | 8/2010 | Bertness | 324/426 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,883,002 B2 | 2/2011 | Jin et al. | 235/376 |
| 7,924,015 B2 | 4/2011 | Bertness | 324/427 |
| 2001/0035737 A1 | 11/2001 | Nakanishi et al. | 320/122 |
| 2002/0004694 A1 | 1/2002 | McLeod | 701/29 |
| 2002/0010558 A1 | 1/2002 | Bertness et al. | 702/63 |
| 2002/0021135 A1 | 2/2002 | Li et al. | 324/677 |
| 2002/0041175 A1* | 4/2002 | Lauper et al. | 320/106 |
| 2002/0044050 A1 | 4/2002 | Derbyshire et al. | 340/442 |
| 2002/0074398 A1 | 6/2002 | Lancos et al. | 235/382 |
| 2002/0118111 A1 | 8/2002 | Brown et al. | 340/573.1 |
| 2002/0171428 A1 | 11/2002 | Bertness | 702/63 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/426 |
| 2003/0036909 A1 | 2/2003 | Kato | 704/275 |
| 2003/0040873 A1 | 2/2003 | Lesesky et al. | 702/57 |
| 2003/0078743 A1 | 4/2003 | Bertness et al. | 702/63 |
| 2003/0088375 A1 | 5/2003 | Bertness et al. | 702/63 |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1* | 9/2003 | Oosaki | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |
| 2004/0113588 A1 | 6/2004 | Mikuriya et al. | 320/128 |
| 2004/0145342 A1 | 7/2004 | Lyon | 320/108 |
| 2004/0164706 A1 | 8/2004 | Osborne | 320/116 |
| 2004/0178185 A1 | 9/2004 | Yoshikawa et al. | 219/270 |
| 2004/0199343 A1 | 10/2004 | Cardinal et al. | 702/63 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness et al. | 320/136 |
| 2005/0007068 A1 | 1/2005 | Johnson et al. | 320/110 |
| 2005/0017726 A1 | 1/2005 | Koran et al. | 324/433 |
| 2005/0021294 A1 | 1/2005 | Trsar et al. | 702/183 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0073314 A1 | 4/2005 | Bertness et al. | 324/433 |
| 2005/0102073 A1 | 5/2005 | Ingram | 701/29 |
| 2005/0128083 A1 | 6/2005 | Puzio et al. | |
| 2005/0159847 A1 | 7/2005 | Shah et al. | |
| 2005/0168226 A1 | 8/2005 | Quint et al. | 324/426 |

| | | | |
|---|---|---|---|
| 2005/0173142 A1 | 8/2005 | Cutler et al. | |
| 2005/0182536 A1 | 8/2005 | Doyle et al. | 701/29 |
| 2005/0218902 A1 | 10/2005 | Restaino et al. | 324/433 |
| 2005/0254106 A9 | 11/2005 | Silverbrook et al. | 358/539 |
| 2005/0256617 A1 | 11/2005 | Cawthorne et al. | 701/22 |
| 2005/0258241 A1* | 11/2005 | McNutt et al. | 235/385 |
| 2006/0012330 A1 | 1/2006 | Okumura et al. | 320/103 |
| 2006/0030980 A1 | 2/2006 | St. Denis | 701/29 |
| 2006/0089767 A1 | 4/2006 | Sowa | 701/29 |
| 2006/0217914 A1 | 9/2006 | Bertness | 702/113 |
| 2006/0282323 A1 | 12/2006 | Walker et al. | 705/14 |
| 2007/0024460 A1 | 2/2007 | Clark | 340/663 |
| 2007/0026916 A1 | 2/2007 | Juds et al. | 463/1 |
| 2007/0194791 A1 | 8/2007 | Huang | 324/430 |
| 2008/0303528 A1 | 12/2008 | Kim | 324/430 |
| 2008/0303529 A1 | 12/2008 | Nakamura et al. | 324/433 |
| 2009/0247020 A1 | 10/2009 | Gathman et al. | 439/759 |
| 2010/0145780 A1 | 6/2010 | Nishikawa et al. | 705/14.11 |
| 2010/0314950 A1 | 12/2010 | Rutkowski et al. | 307/125 |
| 2011/0004427 A1 | 1/2011 | Gorbold et al. | 702/63 |

FOREIGN PATENT DOCUMENTS

| | | |
|---|---|---|
| DE | 19638324 | 9/1996 |
| EP | 0 022 450 A1 | 1/1981 |
| EP | 0 637 754 A1 | 2/1995 |
| EP | 0 772 056 A1 | 5/1997 |
| EP | 0902521 A2 | 3/1999 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

Office Action from U.S. Appl. No. 11/063,247 dated Apr. 11, 2008.

U.S. Appl. No. 60/387,912 filed Jun. 13, 2002, which is related to U.S.Patent No. 7,089,127.

"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).

"Field Application of Conductance Measurements Use to Ascertain Cell/Battery and Inter-Cell Connection State-ofHealth in Electric Power Utility Applications", by M. Hlavac et al., Apr. 1993, pp. 1-14; (19 total pgs.).

"Conductance Testing of Standby Batteries in Signaling and Communications Applications for the Purpose of Evaluating Battery State-of-Health", by S. McShane, Apr. 1993, pp. 1-9; (14 total pgs.).

"Conductance Monitoring of Recombination Lead Acid Batteries", by B. Jones, May 1993, pp. 1-6; (11 total pgs.).

"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).

"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).

"Field Experience of Testing VRLA Batteries by Measuring Conductance", by M.W. Kniveton, May 1994, pp. 1-4; (9 total pgs.).

"Reducing the Cost of Maintaining VRLA Batteries in Telecom Applications", by M.W. Kniveton, Sep. 1994, pp. 1-5; (10 total pgs.).

"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).

"Testing 24 Volt Aircraft Batteries Using Midtronics Conductance Technology", by M. Hlavac et al., Jan. 1995, 9 pgs; (13 total pgs.).

"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).

"VRLA Battery Conductance Monitoring Part V: Strategies for VRLA Battery Testing and Monitoring in Telecom Operating Environments", by M. Hlavac et al., Oct. 1996, 9 pgs; (13 total pgs.).

"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).

"Impedance/Conductance Measurements as an Aid to Determining Replacement Strategies", M. Kniveton, Sep. 1998, pp. 297-301; (9 total pgs.).

"A Fundamentally New Approach to Battery Performance Analysis Using DFRA™/DTIS™ Technology", by K. Champlin et al., Sep. 2000, 8 pgs; (12 total pgs.).

"Battery State of Health Monitoring, Combining Conductance Technology With Other Measurement Parameters for Real-Time Battery Performance Analysis", by D. Cox et la., Mar. 2000, 6 pgs; (10 total pgs.).

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell" by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., IEEE, Aug. 1992, pp. 218-233.

"JIS Japanese Industrial Standard-Lead Acid Batteries for Automobiles", *Japanese Standards Association UDC*, 621.355.2:629.113.006, Nov. 1995.

Office Action dated Jun. 21, 2006 for U.S. Appl. No. 11/207,419, filed Aug. 19, 2005.

Office Action dated Dec. 19, 2006 for U.S. Appl. No. 11/207,419, filed Aug. 19, 2005.

Office Action dated Jul. 10, 2007 for U.S. Appl. No. 11/207,419, filed Aug. 19, 2005.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

Office Action dated Dec. 28, 2009 for U.S. Appl. No. 11/207,419, filed Aug. 19, 2005.

National Semiconductor Corporation, "High Q Notch Filter", Mar. 1969, Linear Brief 5.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115.

"Alligator Clips with Wire Penetrators" *J.S. Popper, Inc.* product information, downloaded from http://www.jspopper.com/, prior to Oct. 1, 2002.

"#12: LM78S40 Simple Switcher DC to DC Converter", *ITM e-Catalog*, downloaded from http://www.pcbcafe.com, prior to Oct. 1, 2002.

"Simple DC-DC Converts Allows Use of Single Battery", *Electronix Express*, downloaded from http://www.elexp.com/t_dc-dc.htm, prior to Oct. 1, 2002.

"DC-DC Converter Basics", *Power Designers*, downloaded from http://www.powederdesigners.com/InforWeb.design_center/articles/DC-DC/converter.shtm, prior to Oct. 1, 2002.

"Notification of Transmittal of the International Search Report or the Declaration", PCT/US02/29461.

"Notification of Transmittal of the International Search Report or the Declaration", PCT/US03/07546.

"Notification of Transmittal of the International Search Report or the Declaration", PCT/US03/06577.

"Notification of Transmittal of the International Search Report or the Declaration", PCT/US03/07837.

"Improved Impedance Spectroscopy Technique for Status Determination of Production Li/SO$_2$ Batteries" Terrill Atwater et al., pp. 10-113, (1992).

"Notification of Transmittal of the International Search Report or the Declaration", PCT/US03/41561.

"Notification of Transmittal of the International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois pp. 1-1-14-13, (1991).

Supplementary European Search Report Communication for Appl. No. 99917402.2; Sep. 7, 2004.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the UK Patent Office for App. No. 0417678.0; Jan. 24, 2005.

Wikipedia Online Encyclopedia, Inductance, 2005, http://en.wikipedia.org/wiki/inductance, pp. 1-5, mutual Inductance, pp. 3,4.

"Professional BCS System Analyzer Battery-Charger-Starting", pp. 2-8, (2001).

Young Illustrated Encyclopedia Dictionary of Electronics, 1981, Parker Publishing Company, Inc., pp. 318-319.

"DSP Applications in Hybrid Electric Vehicle Powertrain", Miller et al., Proceedings of the American Control Conference, Sand Diego, CA, Jun. 1999; 2 ppg.

"Notification of Transmittal of the International Search Report and the Written Opinion of the International Searching Authority, or the Declaration" for PCT/US2008/008702 filed Jul. 2008; 15 pages.

"Notification Concerning Availability of the Publication of the International Application" for PCT/US2008/008702, filed Jul. 17, 2008; 24 pages.

"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.

"First Notice Informing the Applicant of the Communication of the International Application (To Designated Offices which do not apply the 30 Month Time Limit Under Article 22(1))" for PCT/US2008/008702 filed Jul. 17, 2008; one page.

"Notification of the Recording of a Change" for PCT/US2008/008702 filed Jul. 17, 2008; one page.

Search Report and Written Opinion from PCT Application No. PCT/US2011/026608, dated Aug. 29, 2011, 9 pgs.

Appeal Brief as filed by Appellant with the USPTO on Jun. 27, 2008 for corresponding U.S. Appl. No. 11/207,419, 14 pages.

Examiner's Answer for corresponding U.S. Appl. No. 11/207,419, dated Sep. 17, 2008, 16 pages.

Reply Brief as filed by Appellant with the USPTO on Nov. 17, 2008 for corresponding U.S. Appl. No. 11/207,419, 4 pages.

Appeal Decision for corresponding U.S. Appl. No. 11/207,419, dated May 31, 2011, 8 pages.

* cited by examiner

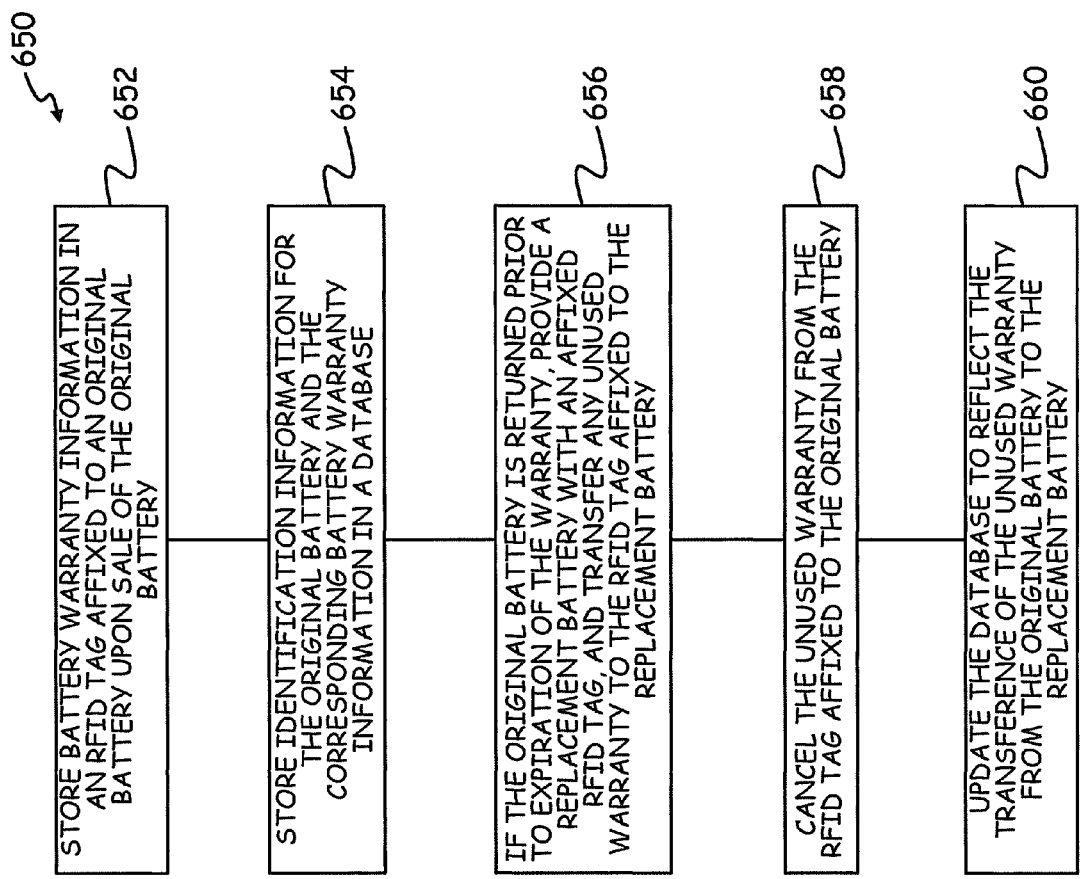

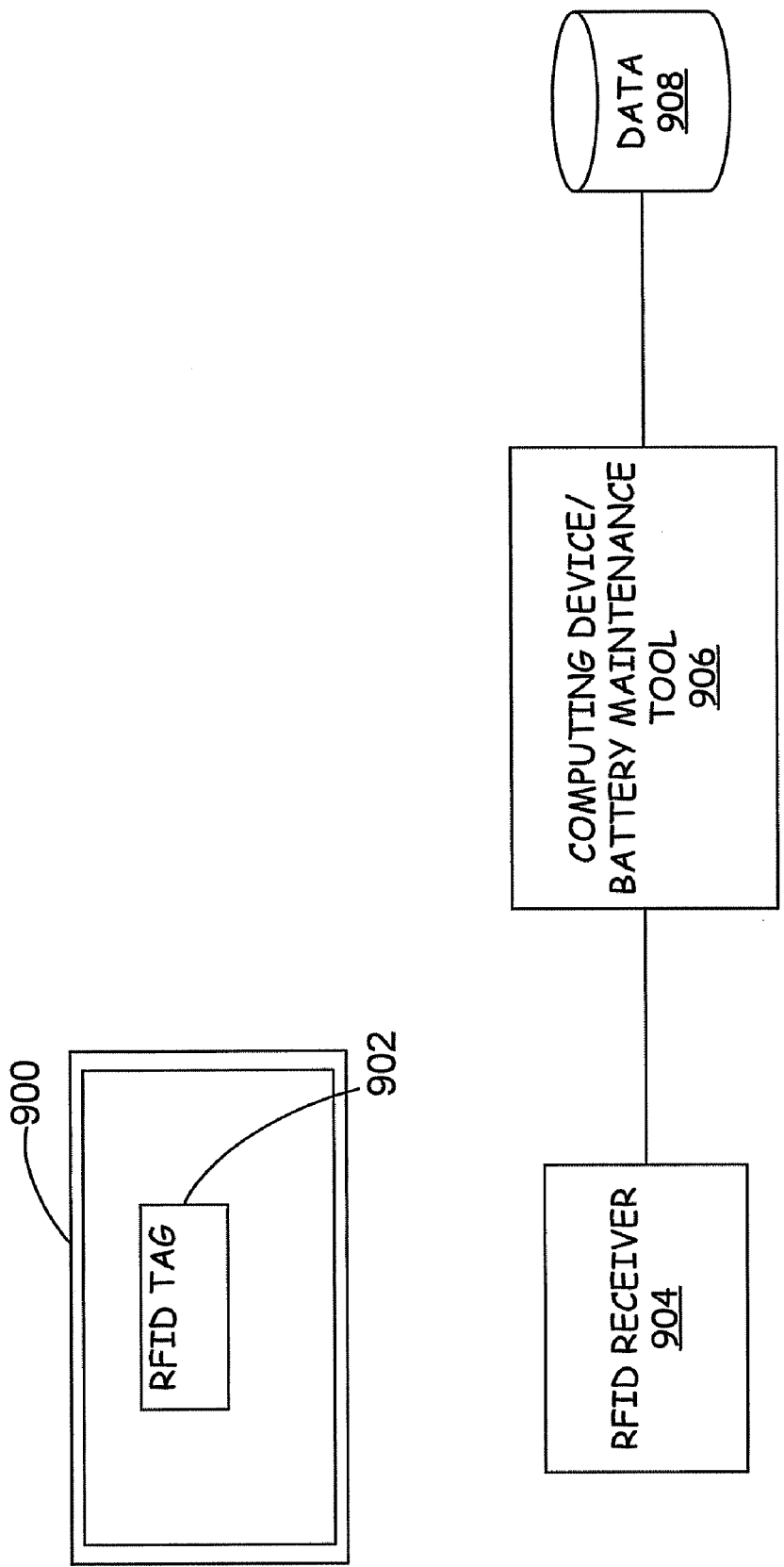

SYSTEM FOR AUTOMATICALLY GATHERING BATTERY INFORMATION

The present application is a Continuation-In-Part of and claims priority of U.S. patent application Ser. No. 11/207,419, filed Aug. 19, 2005, now abandoned which is based on and claims the benefit of U.S. provisional patent application Ser. No. 60/603,078, filed Aug. 20, 2004, the contents of which are hereby incorporated by reference in their entirety.

CROSS REFERENCE TO RELATED APPLICATIONS

Reference is made to co-pending and commonly assigned U.S. patent application Ser. No. 12/416,445, filed Apr. 1, 2009, entitled "SIMPLIFICATION OF INVENTORY MANAGEMENT," and to co-pending and commonly assigned U.S. patent application Ser. No. 12/416,453, filed Apr. 1, 2009, entitled "INTEGRATED TAG READER AND ENVIRONMENT SENSOR," the contents of which are hereby incorporated by reference in their entirety.

BACKGROUND OF THE INVENTION

The present invention relates to storage batteries. More specifically, the present invention relates to a system for automatically gathering battery information for use during battery testing/charging.

Storage batteries, such as lead acid storage batteries, are used in a variety of applications such as automotive vehicles and stand by power sources. Typically, storage batteries consist of a plurality of individual storage cells which are electrically connected in series. Each cell can have a voltage potential of about 2.1 volts, for example. By connecting the cells in series, the voltages of individual cells are added in a cumulative manner. For example, in a typical automotive battery, six storage cells are used to provide a total voltage of 12.6 volts. The individual cells are held in a housing and the entire assembly is commonly referred to as the "battery."

It is frequently desirable to ascertain the condition of a storage battery. Various testing techniques have been developed over the long history of storage batteries. For example, one technique involves the use of a hygrometer in which the specific gravity of the acid mixture in the battery is measured. Electrical testing has also been used to provide less invasive battery testing techniques. A very simple electrical test is to simply measure the voltage across the battery. If the voltage is below a certain threshold, the battery is determined to be bad. Another technique for testing a battery is referred to as a load test. In the load test, the battery is discharged using a known load. As the battery is discharged, the voltage across the battery is monitored and used to determine the condition of the battery. More recently, a technique has been pioneered by Dr. Keith S. Champlin and Midtronics, Inc. of Willowbrook, Ill. for testing storage batteries by measuring a dynamic parameter of the battery such as the dynamic conductance of the battery. This technique is described in a number of United States patents and United States patent applications, for example U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITTANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Pat. No. 6,781,382, issued Aug. 24, 2004, entitled ELECTRONIC BATTERY TESTER; U.S. Pat. No. 6,788,025, filed Sep. 7, 2004, entitled BATTERY CHARGER WITH BOOSTER PACK; U.S. Pat. No. 6,795,782, issued Sep. 21, 2004, entitled BATTERY TEST MODULE; U.S. Pat. No. 6,805,090, filed Oct. 19, 2004, entitled CHARGE CONTROL SYSTEM FOR A VEHICLE BATTERY; U.S. Pat. No. 6,806,716, filed Oct. 19, 2004, entitled ELECTRONIC BATTERY TESTER; U.S. Pat. No. 6,850,037, filed Feb. 1, 2005, entitled IN-VEHICLE BATTERY MONITORING; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 60/575,945, filed Jun. 1, 2004, entitled BATTERY TESTER CAPABLE OF IDENTIFYING FAULTY BATTERY POST ADAPTERS; U.S. Ser. No. 60/577,345, filed Jun. 4, 2004, entitled NEW METHOD FOR AUTOMATICALLY TESTING A BATTERY AND TRANSMITTING DATA TO ANOTHER MODULE IN A VEHICLE; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/870,680, filed Jun. 17, 2004, entitled ELECTRONIC BATTERY TESTER WITH RELATIVE TEST OUTPUT; U.S. Ser. No. 60/582,925, filed Jun. 25, 2004, entitled BATTERY TESTER WITH BATTERY POTENTIAL FOR RECOVERY OUTPUT; U.S. Ser. No. 10/883,019, filed Jul. 1, 2004, entitled MODULAR ELECTRONIC BATTERY TESTER; U.S. Ser. No. 60/585,700, filed Jul. 6, 2004, entitled TEST STATION; U.S. Ser. No. 60/587,232, filed Jul. 12, 2004, entitled WIRELESS BATTERY TESTER; U.S. Ser. No. 10/896,835, filed Jul. 22, 2004, entitled BROADBAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/914,304, filed Aug. 9, 2004, entitled ELECTRONIC BATTERY TESTER WITH NET- WORK COMMUNICATION; U.S. Ser. No. 60/603,078, filed Aug. 20, 2004, entitled SYSTEM FOR AUTOMATICALLY GATHERING BATTERY INFORMATION FOR USE DURING BATTERY TESTING/CHARGING; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; which are incorporated herein in their entirety.

In general, most prior art battery testers/chargers require tester/charger users to enter information related to the battery (such as battery type, battery group size, battery Cold Cranking Amp (CCA) rating, etc.) via a user input such as a keypad. Reliance on user entry of battery information may result in incorrect information being entered, which in turn can result in inaccurate battery test results or improper charging of the battery.

SUMMARY OF THE INVENTION

A method that includes affixing a radio frequency identification (RFID) tag on a storage battery at a battery manufacturing plant is provided. The method also includes storing battery manufacturing information into the RFID tag. The battery manufacturing information includes a battery algorithm suitable for use in testing the storage battery.

BRIEF DESCRIPTION OF THE DRAWINGS

FIG. 6B is a flowchart showing steps of a warranty management method in accordance with one embodiment.

FIG. 9 simplified block diagram showing a method for fraud prevention when RFID tags are used to store battery related information.

DETAILED DESCRIPTION OF THE PREFERRED EMBODIMENTS

Figure 1:
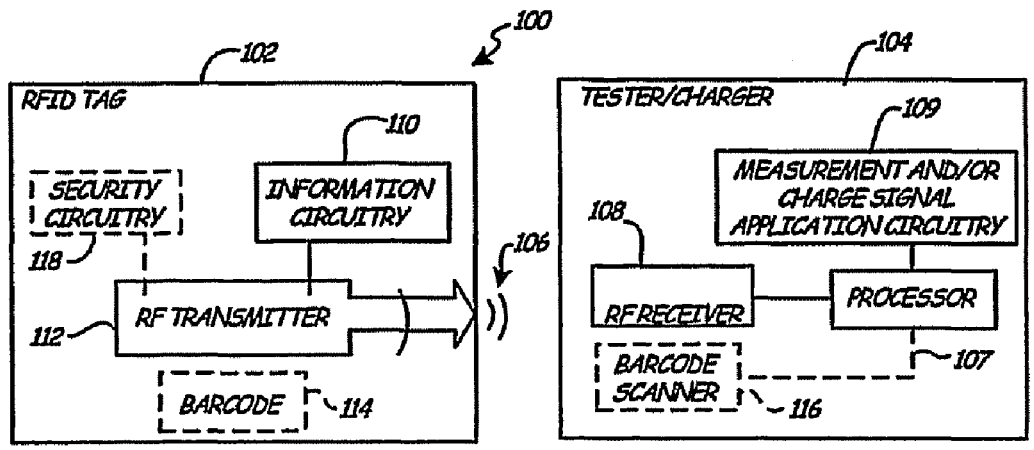
FIG. 1 is a simplified block diagram showing components of a battery testing/charging system in accordance with an embodiment of the present invention.
Figure 2:
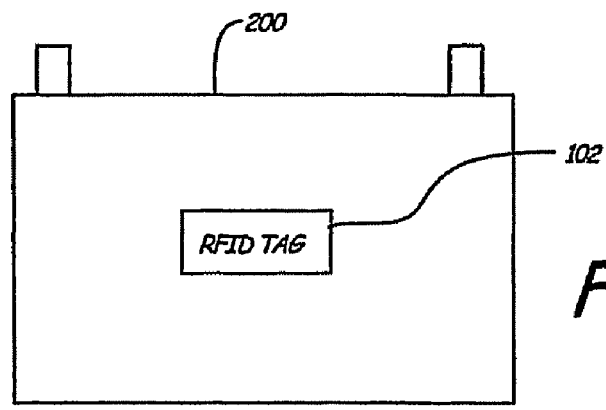
FIG. 2 is a side plan view of a storage battery including a RFID tag in accordance with an embodiment of the present invention.

FIG. 1 is a simplified block diagram of a battery testing/charging system 100 in accordance with an embodiment of the present invention. System 100 includes a radio frequency identification (RFID) tag 102, which can be affixed to a battery (such as 200 (FIG. 2)). RFID tag 102 is configured to transmit stored battery information in the form of RF signals 106. System 100 also includes a battery tester/charger 104 having an embedded/integrated radio frequency (RF) receiver 108, which is configured to receive the transmitted battery information from RF tag 102 when battery tester/charger 104 is proximate RF tag 102. The battery information, which is automatically received by RF receiver 108, is utilized by processor 107 and measurement and/or charge signal application circuitry 109 to test/charge the battery (such as 200 (FIG. 2)). Thus, system 100 overcomes problems with prior art testers/chargers that, in general, require a tester/charger user to enter battery information with the help of a keypad, for example, during a testing/charging process. Of course, for battery information transfer to occur from RFID tag 102 to tester/charger 104, tester/charger 104 should be within a perimeter defined by RF signal 106. The perimeter is selected based upon a type of application and environment for which system 100 is required. Also, a memory size and encoding scheme for RFID tag 102 can be different for different applications. In general, system 100 allows for battery charging/testing with minimal or no user intervention, thereby substantially eliminating any inaccuracies associated with manual entry of battery information.

As can be seen in FIG. 1, RFID tag 102 includes, as it primary components, a battery information storage circuit 110 and a RF transmitter 112. In embodiments of the present invention, battery information storage circuit 110 is configured to store certain basic information regarding the battery. This information includes battery type, battery group size, cold cranking amp (CCA) rating, battery manufacture date (which could later be used for warranty processing), battery cost, etc. In addition to utilizing RFID tag 102 to store the above-noted battery information, RFID tag 102 can also be used to store tracking information, such as a battery serial number, which is useful during the manufacture of the battery, for example. Further, RFID tag 102 could also store previous test results from factory or later tests that could aid in helping to determine battery condition. Previous test information can also be used to show a customer past and present test results. Battery information and other tracking information can be conveniently encoded and RFID tags 102 can be printed on demand using a suitable printer that includes RFID tag printer/encoder programs. In some embodiments, additional information, such as the date of sale of the battery, can be subsequently encoded into RFID tag 102. In embodiments of the present invention, tag or label 102 includes a coating to dissipate static electricity that may corrupt information stored in the tag. As a battery (such a 200) is often used in a harsh and constrained environment, suitable additional protective layers may be used for coating RFID tag 102.

In some embodiments of the present invention, tag 102 also includes bar-coded battery information 114 in addition to the RFID encoded battery information. In some embodiments, the bar-coded battery information may be a copy of the RFID encoded information. In other embodiments, the bar-coded information may be different from the RFID encoded information. Of course, in such embodiments, battery tester/charger 104 includes a barcode reader 116 in addition to RF receiver 108. Tags/labels with the barcode and RFID battery information can be printed from a single printer that includes the necessary label printer/encoder programs. It should be noted that it is possible to produce bar code tags that can contain previous test information that could be useful in providing previous test result information, which could be used in combination with RFID tags, or stand alone information. Production of bar code tags that contain battery test information is described in U.S. Pat. No. 6,051,976, entitled "METHOD AND APPARATUS FOR AUDITING A BATTERY TEST," which is incorporated herein by reference.

In addition to helping automate the battery testing/charging process, battery information stored in RFID tag 102 has other uses such as to help determine whether or not a particular battery is too "old" to be sold. It should be noted that batteries may not be suitable for sale after the expiration of a certain period (16 months, for example). The age of the battery can easily be determined by reading the battery date of manufacture from RFID tag 102. An RFID reader that can automatically detect, identify and accept battery information from all RFID tags in its reading field is especially suitable for a retailer to rapidly identify "old" batteries. Information, such as the date of sale of the battery, included in RFID tag 102, can be used for automating warranty claims processing which is based on the battery age, date of sale, etc. Thus, RFID tag 102 is useful for battery production, storage, monitoring and tracking.

In some embodiments of the present invention, RFID tag 102 includes security circuitry 118, which may be coupled to RF transmitter 112 and may also include a receiver (not shown in FIG. 1) which is capable of receiving signals from an external transmitter (not shown in FIG. 1) that transmits security signals. Details regarding such a security system are included in U.S. Ser. No. 10/823,140, filed Apr. 13, 2004, entitled "THEFT PREVENTION DEVICE FOR AUTOMOTIVE VEHICLE SERVICE CENTERS," which is incorporated herein by reference. Details regarding components of battery tester/charger 104 are provided below in connection with FIGS. 3 and 4.

Figure 3:
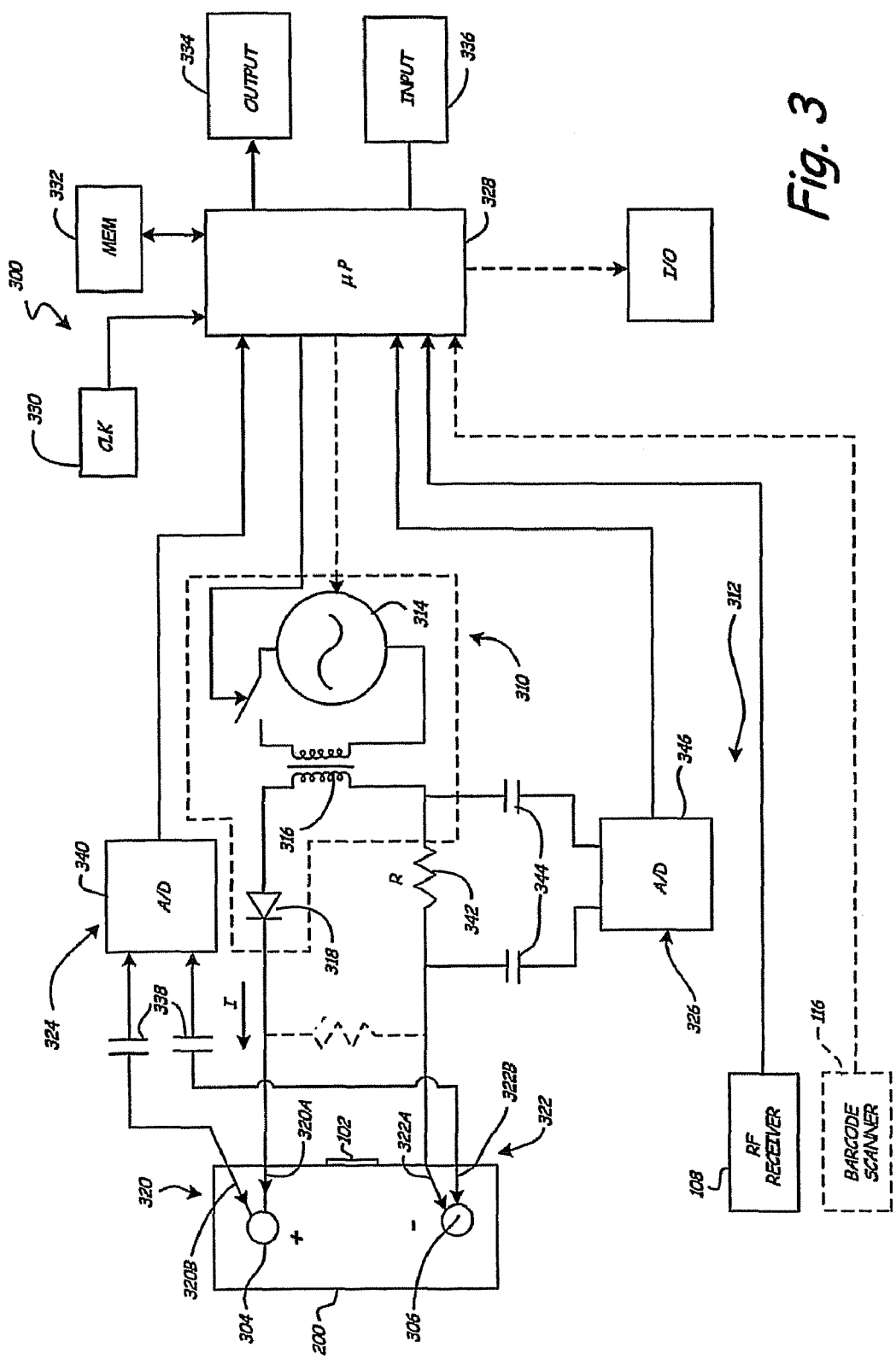
FIG. 3 is a simplified block diagram of an example battery charging system that is capable of receiving information from the RFID tag.

FIG. 3 is a simplified block diagram of a battery charging system 300 in accordance with an embodiment of the present invention. System 300 is shown coupled to battery 200. System 300 includes battery charger circuitry 310 and test circuitry 312. Battery charger circuitry 310 generally includes an alternating current (AC) source 314, a transformer 316 and a rectifier 318. System 300 couples to battery 200 through electrical connection 320 which couples to the positive battery contact 304 and electrical connection 322 which couples to the negative battery contact 306. In one preferred embodiment, a four point (or Kelvin) connection technique is used in which battery charge circuitry 310 couples to battery 300 through electrical connections 320A and 322A while battery testing circuitry 312 couples to battery 200 through electrical connections 320B and 322B.

Battery testing circuitry 312 includes voltage measurement circuitry 324 and current measurement circuitry 326 which provide outputs to microprocessor 328. Microprocessor 328 also couples to a system clock 330 and memory 332 which is used to store information and programming instructions. In the embodiment of the invention shown in FIG. 3, microprocessor 328 also couples to RF receiver 108, user output circuitry 334, user input circuitry 336 and barcode scanner 116, which may be included in some embodiments.

Voltage measurement circuitry 324 includes capacitors 338 which couple analog to digital converter 340 to battery 200 thorough electrical connections 320B and 322B. Any type of coupling mechanism may be used for element 338 and capacitors are merely shown as one preferred embodiment.

Further, the device may also couple to DC signals. Current measurement circuitry 326 includes a shunt resistor (R) 342 and coupling capacitors 344. Shunt resistor 342 is coupled in series with battery charging circuitry 310. Other current measurement techniques are within the scope of the invention including Hall-Effect sensors, magnetic or inductive coupling, etc. An analog to digital converter 346 is connected across shunt resistor 342 by capacitors 344 such that the voltage provided to analog to digital converter 346 is proportional to a current I flowing through battery 200 due to charging circuitry 310. Analog to digital converter 346 provides a digitized output representative of this current to microprocessor 328.

During operation, AC source 314 is coupled to battery 200 through transformer 316 and rectifier 318. Rectifier 318 provides half wave rectification such that current I has a non-zero DC value. Of course, full wave rectification or other AC sources may also be used. Analog to digital converter 346 provides a digitized output to microprocessor 328 which is representative of current I flowing through battery 200. Similarly, analog to digital converter 324 provides a digitized output representative of the voltage across the positive and negative terminals of battery 200. Analog to digital converters 324 and 346 are capacitively coupled to battery 200 such that they measure the AC components of the charging signal.

Microprocessor 328 determines the conductance of battery 200 based upon the digitized current and voltage information provided by analog to digital converters 346 and 324, respectively. Microprocessor 328 calculates the conductance of battery 200 as follows:

$$\text{Conductance} = G = I/V \qquad \text{Eq. 1}$$

where I is the AC charging current and V is the AC charging voltage across battery 200. Note that in one preferred embodiment the Kelvin connections allow more accurate voltage determination because these connections do not carry substantial current to cause a resultant drop in the voltage measured.

The battery conductance is used to monitor charging of battery 200. Specifically, it has been discovered that as a battery is charged the conductance of the battery rises which can be used as feedback to the charger. This rise in conductance can be monitored in microprocessor 328 to determine when the battery has been fully charged.

In accordance with the present invention, as described above, RF receiver 108 and/or barcode scanner 116 are included to substantially eliminate the need for user entry of the necessary battery information.

Figure 4:
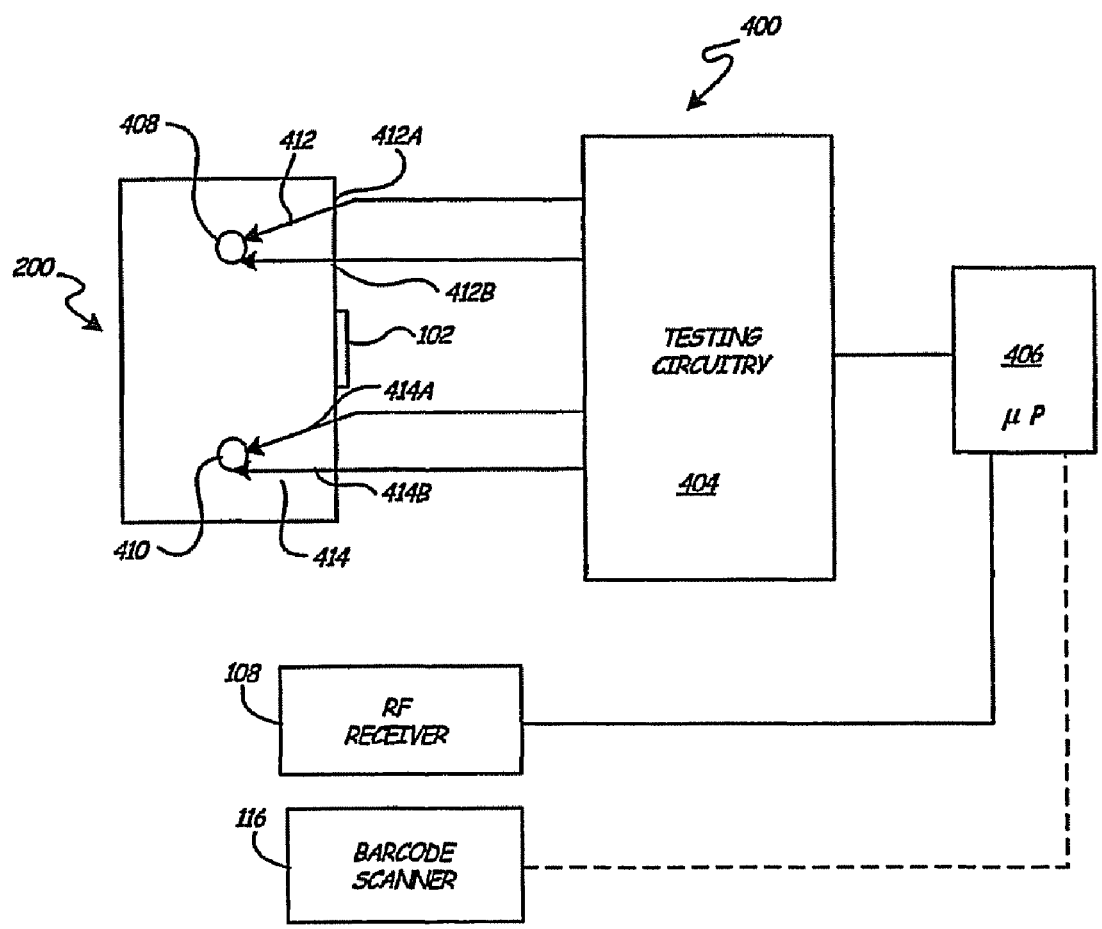
FIG. 4 is a simplified block diagram of an example battery tester that is capable of receiving information from the RFID tag.

FIG. 4 is a simplified block diagram of a battery testing system 400 in accordance with an embodiment of the present invention. System 400 is shown coupled to battery 200. System 400 includes battery testing circuitry 404 and microprocessor 406. System 400 couples to battery contacts 408 and 410 through electrical connections 412 and 414, respectively. In one preferred embodiment, a four point (or Kelvin) connection technique is used. Here, electrical connection 412 includes a first connection 412A and second connection 412B and connection 414 includes a first connection 414A and a second connection 414B. As in the case of battery charging system 300 (FIG. 3), battery testing system 400 also includes RF receiver 108 and barcode scanner 116 to substantially eliminate the need for user entry of the necessary battery information. Battery tester 400 utilizes received battery information to determine a condition of storage battery 200. A description of example components which can be employed to form battery testing circuitry 404 is set forth in U.S. Pat.

No. 6,323,650, issued Nov. 27, 2001, and entitled "ELECTRONIC BATTERY TESTER," which is incorporated herein by reference.

Figure 5:
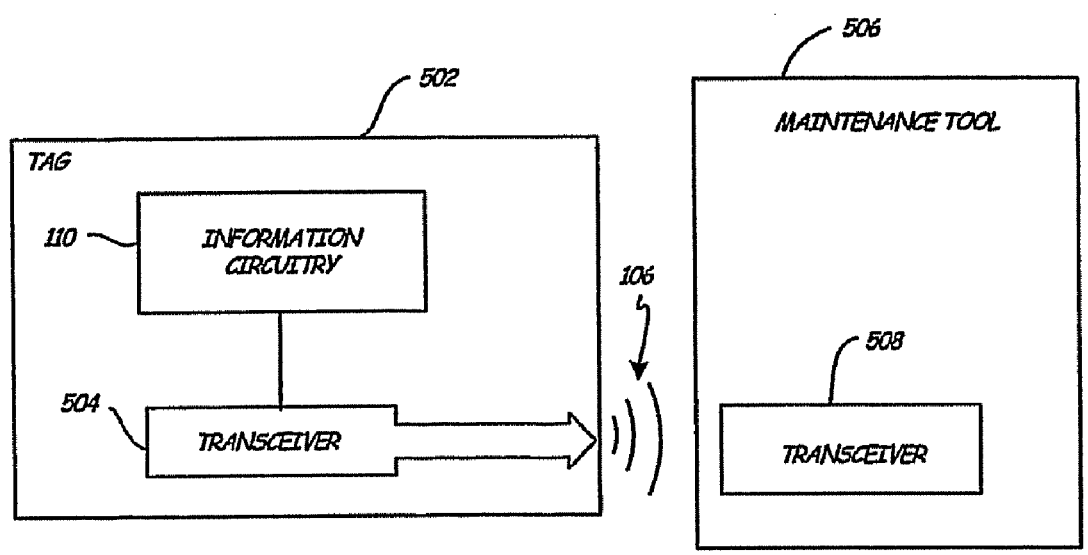
FIG. 5 is a simplified block diagram of a battery maintenance system in accordance with an embodiment of the present invention.

The above-described invention can be employed in either portable or "bench" (non-portable) battery charging and testing systems, and other similar applications such as starter and alternator testing systems. Although the example embodiments described above relate to wireless communication (or transfer of battery information) using RF signals, other wireless communication techniques (for example, diffused infrared signals) that are known in the industry or are developed in the future may be employed without departing from the scope and spirit of the present invention. A general embodiment of a tag (which can be affixed to a storage battery) that can wirelessly transmit information to, or receive information from, a battery maintenance tool (tester, charger, etc.) is shown in FIG. 5. Tag 502 includes information circuitry 110 similar to that described in FIG. 1 and a transceiver 504 for communicating with maintenance tool 506, which also includes a transceiver 508. Different embodiments of tag 502 and maintenance tool 506 can use different wireless communication techniques.

Figure 6A:
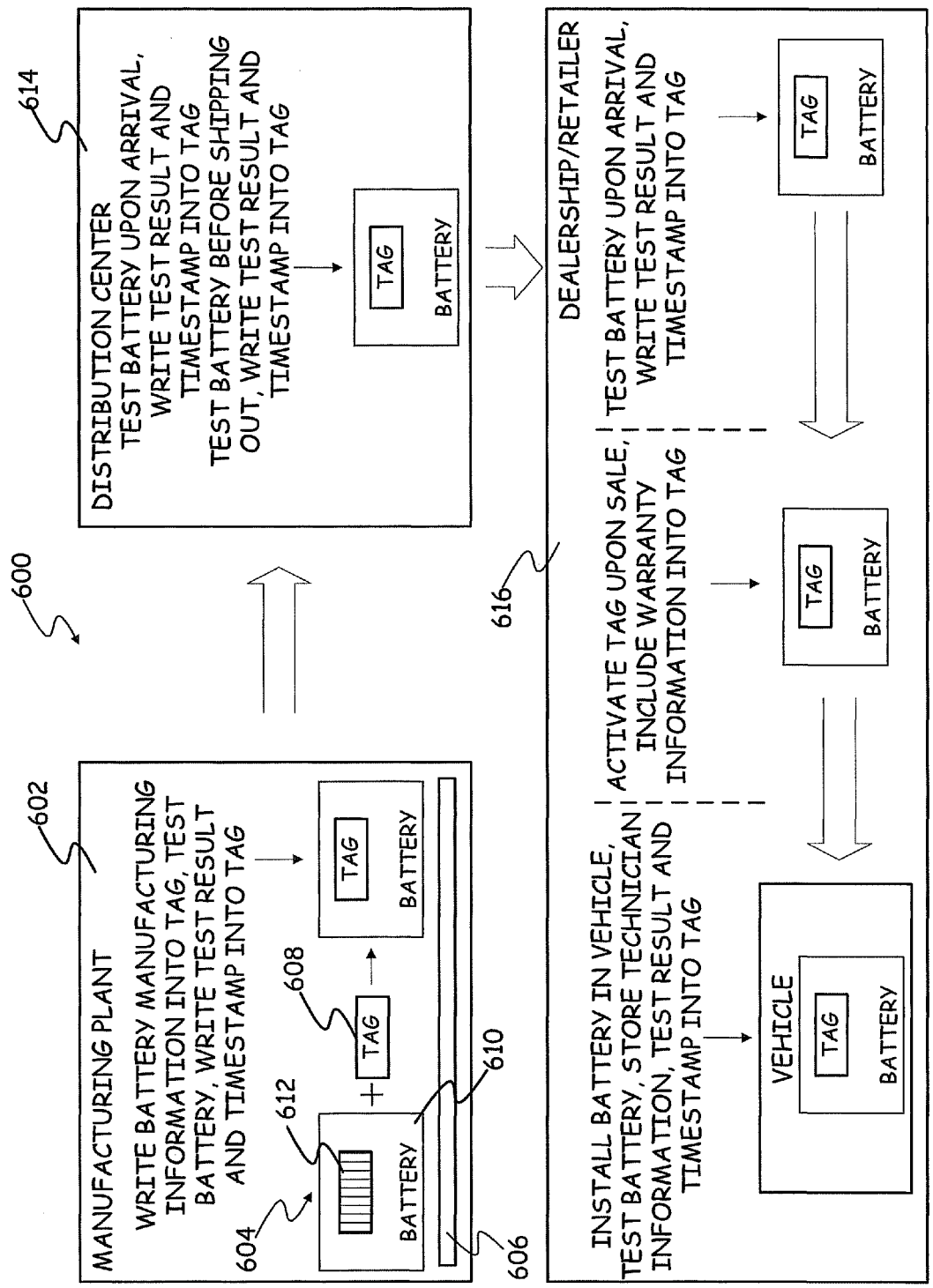
FIG. 6A is a simplified block diagram illustrating the use of information in an RFID tag affixed to a battery at different stages in the life of the battery.

There are several factors that relate to the manufacture, distribution, purchase and treatment of batteries, such as automotive batteries, that impact battery life. For example, when an battery such as automotive battery is purchased, the freshness of the new battery has an impact on the life of the battery because the longer the battery remains in storage without being recharged, the more damaging sulfation there may be on the plates within the battery. Also, consistent and accurate testing and recording of battery test results is important. Thus, in some embodiments, a RFID tag is used to store information about the battery and battery test results at different stages in the life a battery. FIG. 6A illustrates an example of such an embodiment. As can be seen in block diagram 600 of FIG. 6A, battery 604 is assembled on assembly line 606 at manufacturing plant 602. At the end of the assembly of battery 604, RFID tag 608 is affixed to battery housing 610. In one embodiment, battery housing 610 includes a recessed portion 612 within which the RFID tag 608 is affixed. This prevents damage of the RFID tag 608 during transportation and storage of the battery 604, for example. In general, at manufacturing plant 602, battery manufacturing information is stored into RFID tag 608. This can include manufacturing plant and assembly line identification information. In addition to the particular assembly line, the shift during which the battery was assembled can also be stored into the RFID tag 608. Such detailed information related to the manufacture of the battery is useful for quality control audit purposes. Battery manufacturing information stored into RFID tag 608 also includes battery parameters and other battery information such as battery type (for example, flooded (wet), gelled, AGM (Absorbed Glass Mat, etc.), battery rating (for example, cold cranking ampere (CCA) rating), battery post configuration (top post or side post), etc. This battery-specific information facilitates the formation/coding of an algorithm that is tailored to the specific battery type, battery post configuration, etc. The algorithm can be stored into the RFID tag 608 and read and utilized by a battery tester each time the battery is tested, thereby making the type of battery test carried out on the battery consistent and substantially independent of any need for data entry by a battery tester user. After the above-described manufacturing information is loaded in to RFID tag 608 at the manufacturing plant, the battery is tested. As can be seen in FIG. 6A, in manufacturing plant 602, battery 604 is tested using information for RFID tag 608 and a timestamp for the test along with the battery test results are written into RFID Tag 608.

Batteries such as 604 are shipped from a manufacturing plant such as 602 to a distribution center 614. In some embodiments, upon arrival at the distribution center 614, the battery 602 is tested and a timestamp for the test along with the battery test results are written into the RFID tag 608. The battery storage location in the distribution center can also be stored in the RFID tag 608. In some embodiments, prior to shipping the battery 604 to a retailer/dealership 616, a battery test is again performed at distribution center 614. A timestamp for the test along with the battery test results are written into the RFID Tag 606. Upon arrival at the dealership 616, battery manufacturing information is read from RFID tag 608. Using the information read from tag 608, a battery test is conducted on battery 604 at the automobile dealership 616. A battery test result is obtained and the battery test result and a corresponding timestamp stored into the RFID tag 608.

In some embodiments, a battery sale activation code is programmed into RFID tag 608 at the automotive dealership 616. The battery sale activation code is stored in a database. The database also stores information that indicates that the battery is currently for sale at the automotive dealership 616. When selling battery 604 to a customer, the battery sale activation code is read from the RFID tag and utilized to update the database to reflect that the battery has been sold. In general, the sale of battery 64 is proper only if the RFID tag 608 is properly activated. This prevents situations such as a person stealing battery 604 and then returning it to claim a refund, for example. Specifically, this security feature will show that the battery/RFID tag was not properly activated at the time of sale if a return of a stolen battery is attempted.

Selling the battery 604 to the customer also involves storing battery warranty information and a date of sale of the battery into the RFID tag 608. One embodiment of a warranty management method is described below in connection with FIG. 6B.

FIG. 6B is a flowchart 650 showing steps of a warranty management method in accordance with one embodiment. At step 652, battery warranty information is stored in an RFID tag affixed to an original battery upon sale of the original battery. Also, at step 654, identification information for the original battery and the corresponding battery warranty information are stored in a database. At step 656, if the original battery is returned prior to expiration of the warranty, a replacement battery with an affixed RFID tag is provided to the customer, and any unused warranty is transferred to the RFID tag affixed to the replacement battery. At step 658, the unused warranty is cancelled from the RFID tag affixed to the original battery. Further, at step 660, the database is updated to reflect the transference of the unused warranty from the original battery to the replacement battery.

Referring back to FIG. 6A, after entry of battery warranty information into RFID tag 608, battery 604 is installed in a vehicle owned by the customer. Battery 604 is tested upon installation in the vehicle. As described earlier, testing of battery 604 involves reading the battery manufacturing information from the RFID tag 608, conducting a battery test using the battery manufacturing information, and obtaining a battery test result. The battery test result and a corresponding timestamp is stored into the RFID tag 608. In some embodiments, test technician information is also stored into the RFID tag 608. Details about linking vehicle information with battery manufacturing information and battery warranty information in the RFID tag is described below in connection with FIG. 7.

Figure 7:
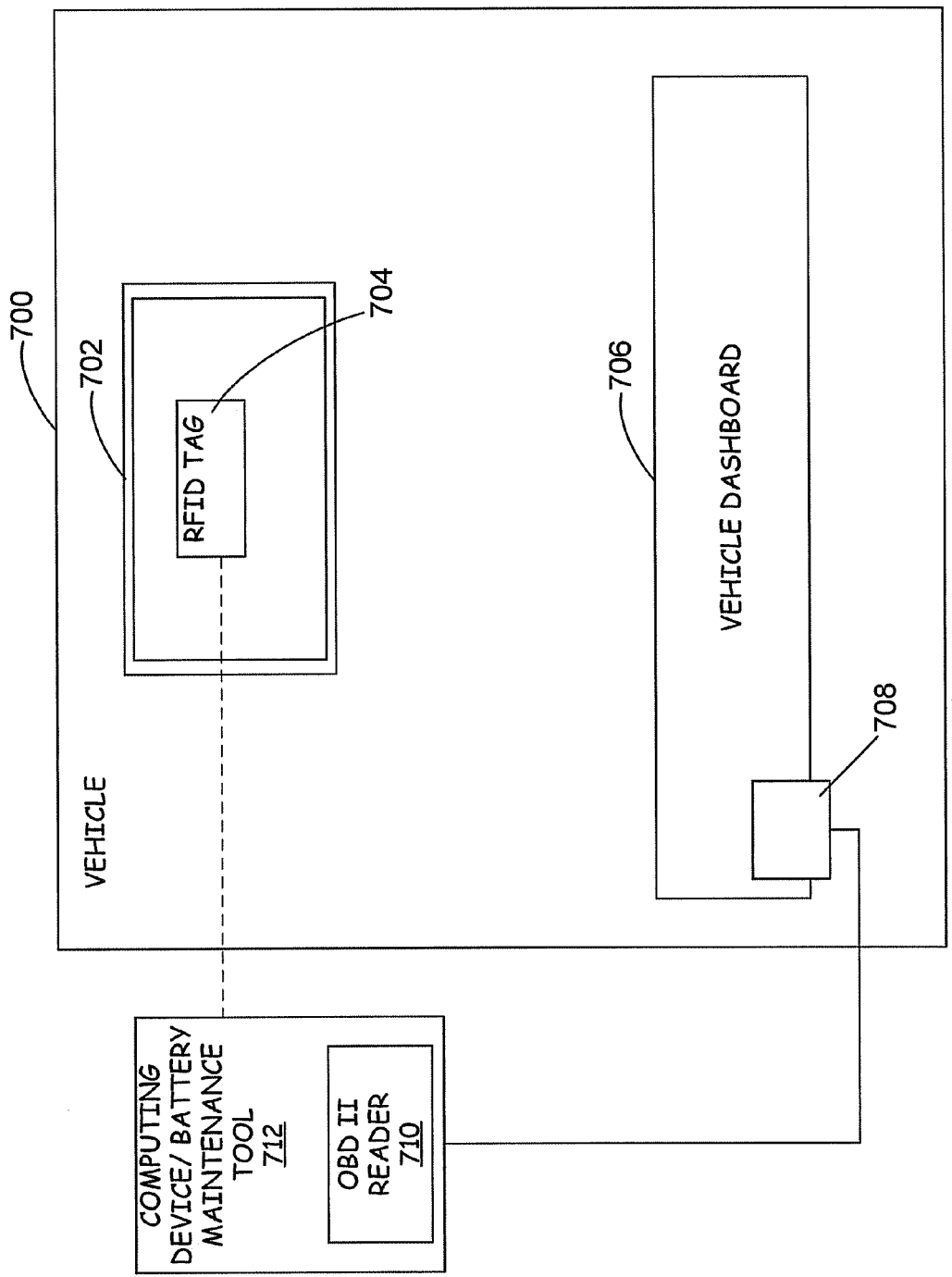
FIG. 7 is a simplified block diagram showing a vehicle having a battery with an affixed RFID tag in accordance with one embodiment.

FIG. 7 is a simplified block diagram showing a vehicle 700 having a battery 702 with an affixed RFID tag 704 in accordance with one embodiment. Vehicle 700 has an on-board diagnostic II (OBDII) connection 706. OBDII connections are known in the art and are used to couple to the OBDII databus (not shown) of modern vehicles. Although, in FIG. 7, vehicle OBDII connection 708 is shown positioned in dashboard 706, connection 708 can be positioned in any suitable location within vehicle 700. The OBD databus, and therefore OBDII connection 708, can be used to retrieve information related to various parameters, such as engine parameters, of the vehicle. Additionally, the OBDII connection 708 provides a connection to the vehicle battery 702. In general, engine parameters, vehicle battery voltage and the vehicle identification number (VIN) can be obtained from the OBDII connection 708. Thus, any suitable connector from a device separate from, or external to, vehicle 700 can be coupled to OBDII connection 708 to obtain the VIN, engine parameters, battery voltage, etc., of vehicle 700. The devices used to obtain the OBDII information can include an OBDII reader 710, which can be separate from, or a part of, a computing device or battery maintenance tool 712. The VIN, engine parameters and battery voltage can be obtained from the OBDII connection 708 and can be programmed into memory of RFID tag 704 using battery maintenance tool 712 or any other suitable device at a vehicle dealership, for example. This, stored information can be read from RFID tag 704 prior to subsequent testing and can help in diagnosing and isolating battery, alternator and/or vehicle starter problems more rapidly and accurately. As indicated above, whether the VIN is obtained via OBDII connection 708, entered manually into a computing device capable of storing the information if RFID tag 704, or obtained using any other suitable method, a VIN stored in RFID tag 704 is useful to tie battery warranty to a specific vehicle. As noted above, the serial number of the battery and warranty information is also stored into the RFID tag.

Figure 8:
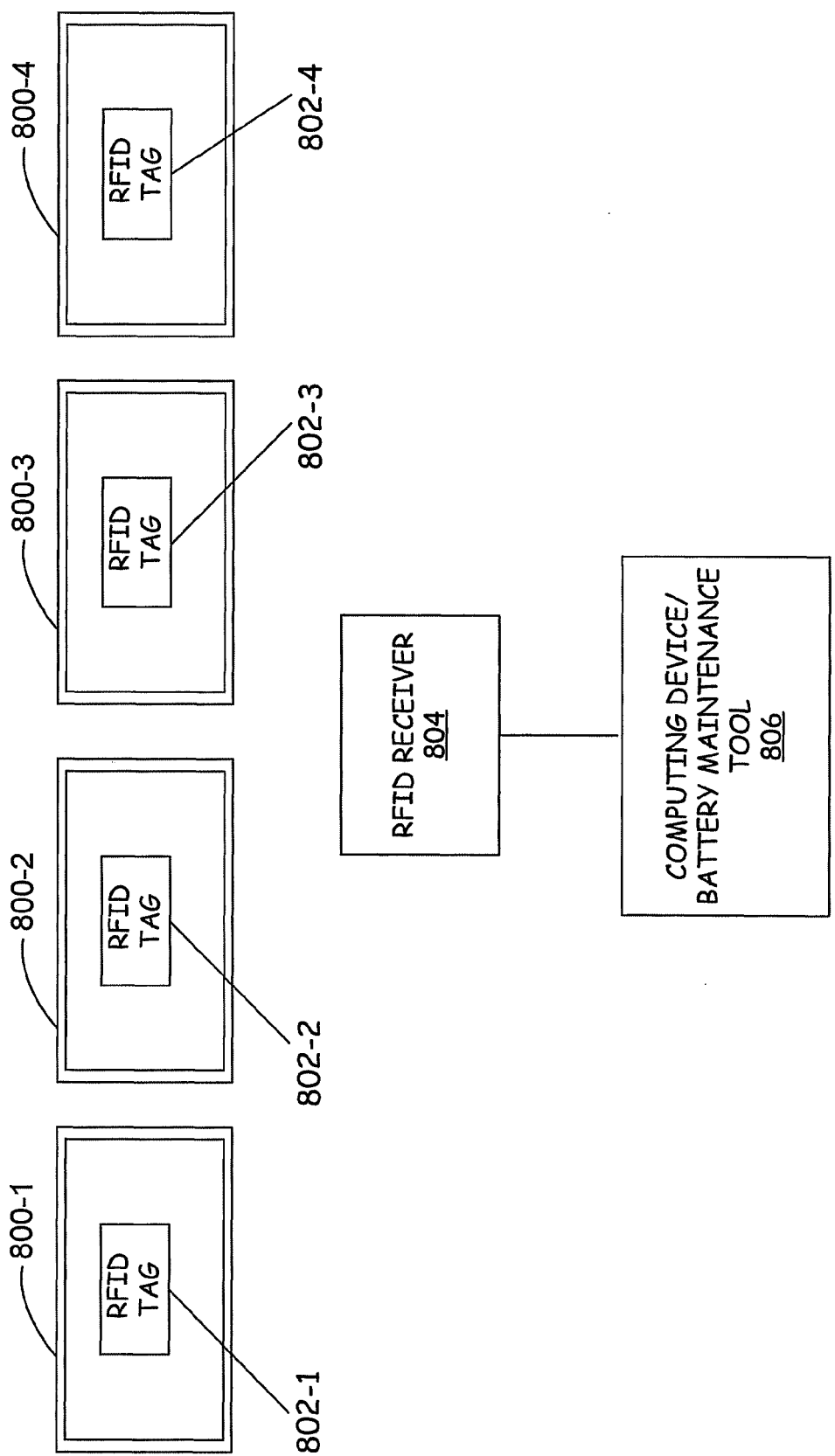
FIG. 8 is a simplified block diagram showing multiple batteries with each of the batteries including an RFID label with balancing information.

In some embodiments, balancing information for multiple battery packs is stored into the RFID tag(s). FIG. 8 shows multiple batteries 800-1 through 800-4, each including a corresponding one of RFID tags 802-1 through 802-4. Battery balancing information in the RFID tags can be used in applications for heavy trucks, for example. In such applications, information stored in the RFID tags (802-1, 802-2, 802-3 and 802-4) can include cranking capacity, time in service, miles in service, geographical location, etc. Specifically, information from individual RFID tags (802-1, 802-2, 802-3, 802-4) can be obtained using RFID receiver 804 and transferred to computing device/battery maintenance tool 806 that includes a memory and a processor that executes program code, which utilizes the information obtained from the individual RFID tags to automatically sort and match appropriate batteries for fleet maintenance, for example. In FIG. 8, RFID receiver 804 is shown as a separate component coupled to computing device/battery maintenance tool 806. However, in some embodiments, RFID receiver 804 is a part of, or integrated with, computing device/battery maintenance tool 806.

As indicated above, in some embodiments, a battery purchase location identifier (store identification number or any other suitable equivalent) is stored into the RFID tag affixed to the battery. Also, as indicated above, storing the date of purchase of the battery into the RFID tag starts the warranty clock.

In some embodiments, a name or other identification information for a technician who tests the storage battery is stored into the RFID tag. This allows for automatic statistical checking of technician proficiency, for example, with the help of a computing device that employs the technician-related information in the RFID tag to determine technician proficiency.

As noted above, in some embodiments, battery test related information, such as battery test results are stored in an RFID tag affixed to the battery. Additionally, in some embodiments, battery trending information (for example, results of multiple tests over time) is stored into the RFID tag affixed to the battery. In such embodiments, battery degradation can be more accurately determined than by using a simple one point snapshot test. Also, data relating to a series of test steps can be stored into the RFID tag. For example, pre-charge test results and a corresponding time stamp and post-charge test results and a corresponding time stamp can be stored. This can be read by a battery maintenance tool and can be used, for example, to determine if enough time has elapsed to allow a proper battery charge.

As noted above, test results and test related data over multiple battery tests over time can be stored in the RFID tag affixed to the battery. The enables a battery maintenance tool having a memory and a processor to carry out a method for retrieving data from a previous test from the RFID tag and comparing the retrieved data to present test data. Also, prior test data from the RFID tag is, in some embodiments, utilized by the battery maintenance tool to determine a "slope" of degradation of the battery to which the RFID tag is affixed. Both pre and post load test results can be stored in the RFID tag, affixed to the battery, and utilized for computations by a battery maintenance tool. The stored battery test-related information, read from the RFID tag and utilized by a battery maintenance tool for battery analysis, could be from two completely different points in time.

FIG. 9 simplified block diagram showing a method for fraud prevention when RFID tags are used to store battery related information. In essence, this method involves retrieving data stored in an RFID tag (such as 902) affixed to a battery (such as 900) and comparing the retrieved data with independent data at a remote database (such as 908). In FIG. 9, RFID receiver 904 is used to retrieve data from RFID tag 902 and computing device/battery maintenance tool 906 is used to compare the retrieved data with independent data retrieved from database 908. Database 908 can be stored in memory of a remote computer, which communicates with computing device/battery maintenance tool 906 using wired or wireless communication. Database 908 can store a copy of warranty information stored in RFID tag 902 at the time of sale of battery 900 by a dealership, for example. Thus, at a later time, when the battery 900 is brought to the dealership, the above data comparisons can be used, for example, to determine whether warranty information stored in the RFID tag 902 has been altered subsequent to purchase to improperly gain additional warranty. In general, this data comparison technique is particularly useful for the purpose of fraud prevention and/or warranty verification.

As noted above, in some embodiments, the battery manufacturing date and the data of sale of the battery or the battery in-service date (date the battery was put in service) are stored into the RFID tag affixed to the battery. In one embodiment, the battery manufacturing date from the RFID tag is used, by a battery maintenance tool or other computing device, to compare with the battery in-service date for tracking battery shelf life and supply chain stock rotation problems (i.e., improper first in, first out (FIFO) inventory control).

As noted earlier, in some embodiments, manufacturing plant or assembly line information is stored into the RFID tag affixed to the battery. In addition to the particular assembly line, the shift during which the battery was assembled can also be stored in the RFID tag. Such detailed information related to the manufacture of the battery is useful for quality control audit purposes. Obtaining manufacturing related information from the RFID tags and processing of this information for quality control audit purposes is carried out by a suitable computing device having an RFID receiver, a processor and a memory with necessary programmed instructions.

Although the present invention has been described with reference to preferred embodiments, workers skilled in the art will recognize that changes may be made in form and detail without departing from the spirit and scope of the invention. It should be noted that the barcode(s) (used in some embodiments of the tag) and the corresponding barcode scanner (used in some embodiments of the tester/charger) are optional and therefore the invention can operate only with the RFID encoded battery information in the tag and a corresponding RF receiver in the tester/charger. It should be noted that the above invention is suitable for use in battery testers, chargers or a combined battery tester and charger.

What is claimed is:

1. A method comprising:
affixing a radio frequency identification (RFID) tag on a storage battery at a battery manufacturing plant;
storing battery manufacturing information into the RFID tag, the battery manufacturing information including a battery algorithm suitable for use in testing the battery;
reading the battery manufacturing information from the RFID tag at an automobile dealership;
conducting a battery test at the automobile dealership using the battery manufacturing information;
obtaining a battery test result at the automobile dealership; and
storing the battery test result and a corresponding timestamp into the RFID tag at the automobile dealership.

2. The method of claim 1 and further comprising:
reading the battery manufacturing information from the RFID tag at the battery manufacturing plant;
testing the battery at the battery manufacturing plant using the battery manufacturing information;
obtaining a battery test result at the battery manufacturing plant; and
storing the battery test result and a corresponding timestamp into the RFID tag at the battery manufacturing plant.

3. The method of claim 1 and further comprising:
reading the battery manufacturing information from the RFID tag at a battery distribution center;
conducting a battery test at the battery distribution center using the battery manufacturing information;
obtaining a battery test result at the battery distribution center; and
storing the battery test result and a corresponding timestamp into the RFID tag at the battery distribution center.

4. The method of claim 1 and further comprising programming a battery sale activation code into the RFID tag at the automotive dealership.

5. The method of claim 4 and further comprising storing the battery sale activation code in a database and indicating, in the database, that the battery is currently for sale at the automotive dealership.

6. The method of claim 5 and further comprising selling the battery to a customer, wherein selling the battery to a customer comprises:
reading the battery sale activation code from the RFID tag;
utilizing the battery sale activation code to update the database to reflect that the battery has been sold.

7. The method of claim 6 and wherein selling the battery to the customer further comprises storing battery warranty information and a date of sale of the battery into the RFID tag.

8. The method of claim 1 and further comprising installing the battery in a vehicle and testing the battery upon installation in the vehicle.

9. The method of claim 8 and wherein testing the battery upon installation in the vehicle comprises:
reading the battery manufacturing information from the RFID tag when the battery is first installed in the vehicle;
conducting a battery test using the battery manufacturing information when the battery is first installed in the vehicle;
obtaining a battery test result when the battery is first installed in the vehicle; and
storing the battery test result and a corresponding timestamp into the RFID tag when the battery is first installed in the vehicle.

10. The method of claim 9 and further comprising storing test technician information into the RFID tag.

11. The method of claim 9 and further comprising:
obtaining information related to the vehicle in which the battery is installed; and
storing the information related to the vehicle in the RFID tag.

12. The method of claim 11 wherein obtaining information related to the vehicle comprises obtaining information related to the vehicle from on-board diagnostic II (OBDII) connection of the vehicle.

13. The method of claim 12 and wherein the information related to the vehicle obtained from the OBDII connection comprises a vehicle identification number VIN of the vehicle.

14. The method of claim 1 and further comprising utilizing the timestamp stored in the RFID tag to track stock rotation and shelf life of the battery.

15. The method of claim 1 wherein the information related to the manufacture of the battery comprises manufacturing plant information and assembly line information.

16. The method of claim 15 and further comprising utilizing the manufacturing plant information and the assembly line information for quality control audit purposes.

17. A method comprising:
storing battery warranty information in an RFID tag affixed to an original battery upon sale of the original battery; and
if the original battery is returned prior to expiration of the warranty, providing a replacement battery with an affixed RFID tag, and transferring any unused warranty to the RFID tag affixed to the replacement battery.

18. The method of claim 17 and further comprising storing identification information for the original battery and the corresponding battery warranty information in a database.

19. The method of claim 18 and further comprising:
canceling the unused warranty from the RFID tag affixed to the original battery; and
updating the database to reflect the transference of the unused warranty from the original battery to the replacement battery.

20. An apparatus comprising:
a label configured to be affixed to a storage battery, the label is configured to store and wirelessly transmit information related to the battery; and
a computing device comprising:
a computing device memory;
a processor; and a receiver, which operates under the control of the processor, configured to receive the transmitted information related to the battery, wherein the computing device is a battery tester, and wherein the label is configured to store information related to a plurality of tests over time carried out on the battery.

21. The apparatus of claim 20 and wherein the label is further configured to store information related to a vehicle in which the battery is used.

22. The apparatus of claim 21 and wherein the computing device is configured to obtain the information related to the vehicle in which the battery is used and to program the obtained information related to the vehicle in which the battery is used into the label.

23. The apparatus of claim 22 and wherein the information related to the vehicle in which the battery is used is obtained by the computing device from an on-board diagnostic II (OBDII) connection of the vehicle.

24. The apparatus of claim 23 and wherein the information related to the vehicle obtained from the OBDII connection comprises a vehicle identification number VIN of the vehicle.

25. The apparatus of claim 24 and wherein the label is further configured to store warranty information related to the battery, and wherein the VIN of the vehicle ties the battery warranty information to the vehicle.

26. The apparatus of claim 20 and wherein the label configured to be affixed to the battery is one of a plurality of labels configured to be affixed to a plurality of batteries, and each one of the plurality of labels is configured to store balancing information for corresponding ones of the plurality of batteries.

27. The apparatus of claim 26 and wherein the computing device is configured to obtain the balancing information for individual ones of the plurality batteries and to sort the individual ones of the plurality of batteries based on the balancing information.

28. The apparatus of claim 27 and wherein the battery balancing information comprises a cranking capacity of each battery of the plurality of batteries, a time in service of each battery of the plurality of the batteries, miles in service of each battery of the plurality of batteries and geographical location of each battery of the plurality of batteries.

29. The apparatus of claim 20 and wherein the label is further configured to store warranty information related to the battery, battery purchase location identification information and a data of purchase of the battery, wherein the date of purchase of the battery starts a warranty clock.

30. The apparatus of claim 20 and wherein the battery tester is configured to program test technician information into the label, the technician information allows for statistical checking of technician proficiency.

31. The apparatus of claim 20 and wherein the battery tester is configured to determine a degradation of the battery based on the information related to the plurality of battery tests.

32. The apparatus of claim 20 and wherein the information related to the plurality of tests comprises battery pre-charge test results and a corresponding timestamp for the pre-charge test and post charge test results and a corresponding timestamp for the post-charge test results.

33. The apparatus of claim 32 and wherein the battery tester is configured to determine, based on the pre-charge test results and the pre-charge timestamp, and the post charge test results and the post charge time stamp, whether adequate time has elapsed to allow for proper charging of the battery.

34. The apparatus of claim 31 and wherein the battery tester is further configured to determine a slope of degradation of the battery.

35. The apparatus of claim 20 wherein the battery tester is configured to carry out a load test on the battery and wherein the battery tester is further configured to store pre-load test results and post-load test results into the label, wherein the load test is one of the plurality of tests carried out on the battery, and wherein the pre-load test results and the post-load test results are a part of the information related to the plurality of tests carried out on the battery.

36. The apparatus of claim 20 and further comprising a database stored in a remote memory that is separate from the computing device memory, the remote memory comprising a copy of information related to the battery stored in the label at the time of sale of the battery.

37. The apparatus of claim 36 and wherein the computing device is configured to:
obtain information related to the battery from the label;
obtain information related to the battery from the database;
compare the information related to the battery obtained from the label with the information related to the battery obtained from the database;
output any discrepancies between the information related to the battery obtained from the label and the information related to the battery obtained from the database.

38. The apparatus of claim 20 and wherein the label is further configured to store a date of manufacture of the battery and an in-service date of the battery.

39. The apparatus of claim 38 and wherein the computing device is configured to, based the date of manufacture of the battery and the in-service date of the battery stored in the label, track stock rotation and shelf life of the battery.

40. The apparatus of claim 20 and wherein the label is further configured to store information related to manufacture of the battery, and wherein the information related to the manufacture of the battery comprises manufacturing plant information and assembly line information.

41. The apparatus of claim 40 and wherein the computing device is configured to utilize the manufacturing plant information and the assembly line information for quality control audit purposes.

* * * * *